United States Patent
Ozaku et al.

(10) Patent No.: US 9,778,332 B2
(45) Date of Patent: Oct. 3, 2017

(54) SPINNING CONTROLLER FOR NMR SAMPLE TUBE

(71) Applicant: JEOL Ltd., Tokyo (JP)

(72) Inventors: Tomio Ozaku, Tokyo (JP); Yusuke Nishiyama, Tokyo (JP)

(73) Assignee: JEOL Ltd., Tokyo (JP)

( * ) Notice: Subject to any disclaimer, the term of this patent is extended or adjusted under 35 U.S.C. 154(b) by 841 days.

(21) Appl. No.: 14/254,053

(22) Filed: Apr. 16, 2014

(65) Prior Publication Data

US 2014/0312900 A1   Oct. 23, 2014

(30) Foreign Application Priority Data

Apr. 17, 2013  (JP) ................................. 2013-86500

(51) Int. Cl.
    *G01R 33/30*   (2006.01)
(52) U.S. Cl.
    CPC ................................ *G01R 33/307* (2013.01)
(58) Field of Classification Search
    CPC .................................................. G01R 33/307
    See application file for complete search history.

(56) References Cited

U.S. PATENT DOCUMENTS

| | | | | |
|---|---|---|---|---|
| 5,754,048 A | * | 5/1998 | Bielecki | G01R 33/307 324/321 |
| 6,653,832 B2 | * | 11/2003 | Wind | G01R 33/54 324/307 |
| 6,670,811 B2 | * | 12/2003 | Wind | G01R 33/54 324/307 |
| 6,836,115 B2 | * | 12/2004 | Wind | G01R 33/54 324/307 |
| 7,591,314 B2 | * | 9/2009 | Sonnier | E21B 31/00 166/117.7 |
| 9,547,052 B2 | * | 1/2017 | Endo | G01R 33/307 |

FOREIGN PATENT DOCUMENTS

| | | |
|---|---|---|
| JP | 3229183 A | 10/1991 |
| JP | 2797100 B2 | 7/1998 |

OTHER PUBLICATIONS

Published Technical Report No. 92-22816, Sep. 16, 1992, 5 pages.

* cited by examiner

*Primary Examiner* — Dixomara Vargas
(74) *Attorney, Agent, or Firm* — The Webb Law Firm (57) ABSTRACT

A spinning controller has an arithmetic unit (18) and a controller (20). The arithmetic unit (18) establishes gate periods Tg for a pulse sequence signal (110) produced concomitantly with spinning of a sample tube (40) and obtains a count value (Ns) by counting the number of pulses falling within each gate period Tg. The arithmetic unit (18) has functions of finding differences in time from each gate period Tg to the pulse sequence signal (110) occurring around the starting point and ending point of each gate period Tg by making use of a high-speed clock signal (120) and of correcting the duration of the gate period Tg, based on the differences in time.

5 Claims, 7 Drawing Sheets

SPINNING CONTROLLER FOR NMR SAMPLE TUBE

BACKGROUND OF THE INVENTION

Field of the Invention

The present invention relates to a controller for controlling the spinning of a sample tube used in NMR measurements.

Description of Related Art

In some NMR (nuclear magnetic resonance) measurements, a sample tube holding a sample therein is spun. For example, in solid-state NMR measurements, a sample tube holding a solid sample therein is spun at high speed while tilted at a given angle (magic angle) with respect to the direction of a static magnetic field. Under this condition, a transmit/receive coil surrounding the sample tube generates an RF magnetic field. The resulting NMR signal is detected by the transmit/receive coil.

In the above-described NMR measurements, it is necessary to measure the spinning rate of the sample tube. For example, JP-A-3-229183 discloses an apparatus for measuring the spinning rate of an NMR sample tube. A reflecting plate is mounted on the surface of the sample tube. Light is directed at the reflecting plate. As the sample tube is spun, variations of the level of light reflected from the reflecting plate are detected as a pulse sequence signal. The spinning rate is determined based on the pulse sequence signal. Published Technical Report No. 92-22816 of Japan Institute of Invention and Innovation discloses a method of measuring the spinning rate of a sample tube having a portion reflecting light by illuminating the sample tube with light and detecting variations of the level of reflected light as a pulse sequence signal, the variations being caused concomitantly with spinning of the sample tube.

Figure 7:
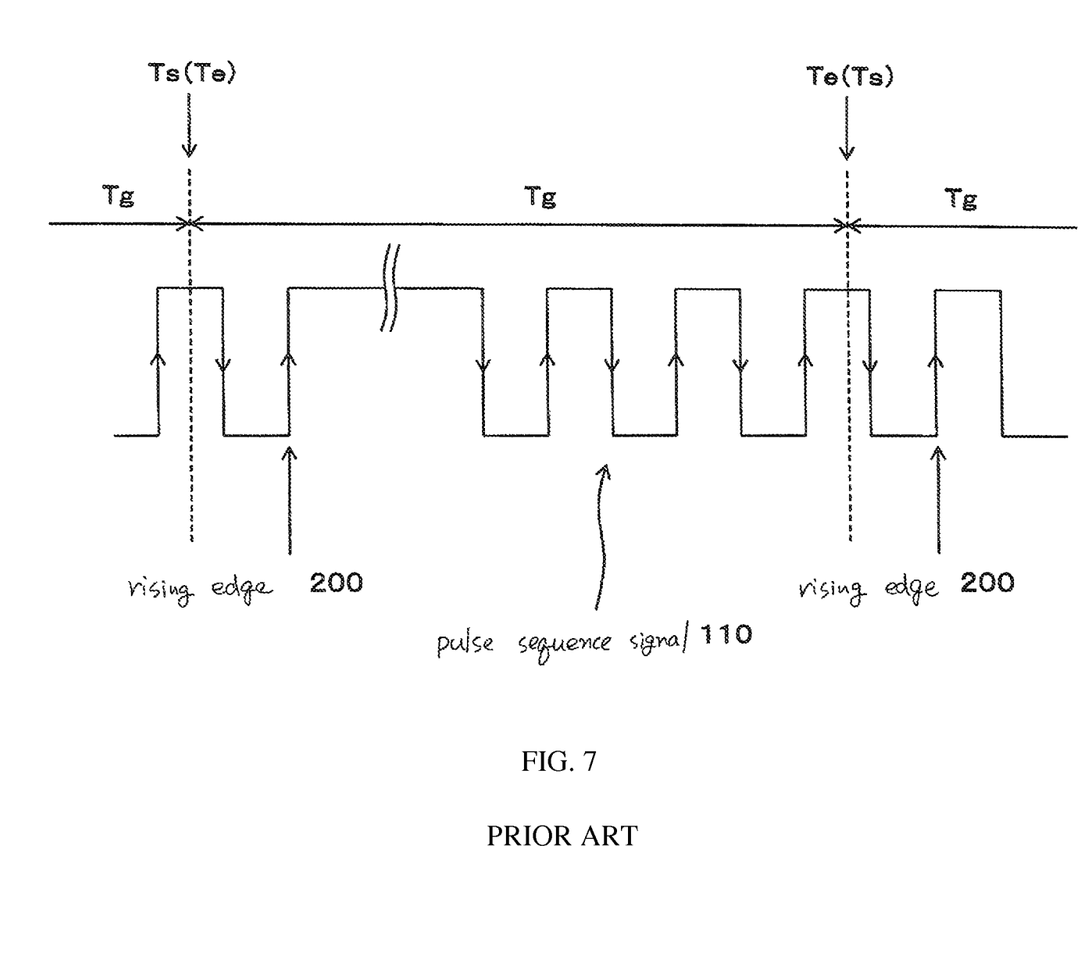
FIG. 7 is a diagram illustrating a relationship between a pulse sequence signal representing spinning and gate periods, the relationship being used in a related art method.

Japanese Patent No. 2,797,100 discloses a liquid level detector for detecting a liquid level by detecting the difference in static capacitance between air inside a container and a liquid as a digital waveform signal and comparing this digital waveform signal against a reference clock signal.

Where the spinning rate of an NMR sample tube is found based on a pulse sequence signal representing the spinning of the tube, a method as illustrated in FIG. 7 is utilized as an example. A pulse sequence signal 110 shown in FIG. 7 consists of a plurality of pulses arranged in a time-sequenced order (from left to right as viewed in the figure). In relation to this pulse sequence, gate periods Tg of a given duration are established in turn. The number of pulses falling within each gate period Tg is counted. The spinning rate (rotational speed) F is found from the obtained count value Ns. The spinning rate F is given by $$F = \frac{Ns}{M \cdot Tg} \qquad (1)$$

where M is the number of pulses detected during one revolution of the sample tube.

As shown in FIG. 7, the starting point Ts of one gate period Tg may not be coincident with the timing at which the rising edge 200 of a pulse representing spinning is detected or the ending point Te may not be coincident with the timing at which the falling edge of the pulse is detected because the gate periods are not synchronized with the pulse sequence signal representing spinning. In FIG. 7, the rising edges of the pulses are indicated by upwardly directed arrows, while the falling edges the pulses are indicated by downwardly directed arrows. Since the gate periods Tg and the pulse sequence signal are not synchronized in this way, deviations in time (i.e., errors in time) occur around the beginning and ending of each gate period Tg. An error corresponding to one period, at maximum, may occur. Accordingly, a range in which the true spinning rate F exists is given by Eq. (2). The accuracy at which the spinning rate F is measured is given by Eq. (3).

$$\frac{Ns}{M \cdot Tg} \leq F < \frac{Ns+1}{M \cdot Tg} \qquad (2)$$

$$\frac{1}{M \cdot Tg} \text{ or } \pm \frac{1}{2M \cdot Tg} \qquad (3)$$

The aforementioned errors in time deteriorate the accuracy at which the spinning rate is measured. It is conceivable to increase the duration of each gate period Tg such that the number of detected pulses is increased, for reducing the measurement error. However, if the duration of each gate period Tg is prolonged, the time interval during which the spinning rate is computed is increased and so the time taken until the measurement results are fed back to the spinning control system is lengthened. This deteriorates the responsiveness of the feedback control. Furthermore, local variations in spinning rate cannot be detected. Consequently, feedback control cannot be provided in response to the variations.

SUMMARY OF THE INVENTION

It is an object of the present invention to improve the accuracy at which the spinning rate of an NMR sample tube is measured, whereby the spinning of the sample tube can be controlled more accurately.

A spinning controller associated with the present invention and used for an NMR sample tube has: computing means for establishing gate periods for a pulse sequence signal representing spinning of the sample tube and produced concomitantly with the spinning of the sample tube and for finding a spinning rate per unit time, based on the number of pulses included in the pulse sequence signal and falling within each of the gate periods; and control means for controlling spinning of the sample tube, based on the spinning rate per unit time. The computing means has correction means for finding differences in time occurring around the beginning and ending of each of the gate periods due to asynchronization between the pulse sequence signal and the gate periods and for correcting the spinning rate per unit time, based on the differences in time.

In the above-described configuration, if differences in time occur between the pulse sequence signal representing the spinning and each gate period, the differences in time can be identified in practice and the spinning rate (rotational speed) per unit time can be corrected based on the differences in time. That is, in computing the spinning rate per unit time, errors arising from the differences in time can be eliminated or reduced. As a consequence, the spinning of the sample tube can be controlled more precisely. Preferably, the duration of each gate period is corrected based on the differences in time and thus the spinning rate per unit time is corrected. Instead, the number of pulses representing the spinning may be corrected. Furthermore, the spinning rate per unit time may be corrected afterward. In either case, if differences in time are measured in practice and a correction is made based on the results of the measurements, errors arising from the differences in time can be eliminated or reduced.

Preferably, the correction means finds a difference in ending time from the ending point of each of the gate periods to a timing at which an immediately subsequently occurring pulse is detected, based on a reference clock signal faster than the pulse sequence signal, the reference clock signal being synchronized with the gate periods. If the time difference is computed based on the reference clock signal synchronized with the gate periods, it is possible to avoid generation of other difference in time between the gate periods and the reference clock signal. Furthermore, if the differences in time are calculated based on the reference clock signal faster than the pulse sequence signal, the differences in time can be identified with improved time resolution. Preferably, a reference clock signal sufficiently faster than the pulse sequence signal representing the spinning is employed. Especially preferably, a reference clock signal from which the gate periods are generated is utilized. The differences in starting time may be measured independently. The difference in ending time calculated in one previous gate period can be used as they are as described below.

Preferably, the correction means uses a difference in ending time of the (n−1)th gate period also as a difference in starting time of the nth gate period and corrects the duration of the nth gate period, based on the differences in starting time and ending time found regarding the nth gate period. In this configuration, only if the difference in ending time is found for each gate period, it follows that the differences in both starting time and ending time are identified for individual gate periods. Hence, the amount of computation can be curtailed. The correcting operation can be carried out quickly. After the ending point of the (n−1)th gate period, the timing at which the first pulse belonging to the next nth gate period is detected comes. Therefore, it is natural and rational to identify the difference in time between the ending timing of the (n−1)th gate period and the timing at which the immediately subsequently occurring pulse is detected as the difference in ending time regarding the (n−1)th gate period. It is conceivable to identify the difference in ending time defined prior to the ending timing of the (n−1)th gate period by retroactively identifying the timing at which the pulse occurring immediately prior to the ending timing of the (n−1)th gate period is detected, based on this ending timing. In this case, prior to computation of the spinning rate, 1 is subtracted from the number of pulses counted during the (n−1)th gate period.

Preferably, the correction means finds a corrected duration of gate period by subtracting the difference in starting time from the duration of each of the gate periods and adding the difference in ending time to the duration of each gate period. The correction means calculates the spinning rate per unit time, based on the corrected duration of gate period. In this configuration, the spinning rate per unit time can be computed under the condition where gate periods are matched (in a sense, synchronized) to the pulse sequence signal representing the spinning. From another standpoint, it is possible to build a circumstance in which the durations of the individual gate periods are adapted to the array of pulses in the pulse sequence signal.

The control means may control the pressure of a jet stream for spinning the sample tube, based on the spinning rate per unit time found by the computing means. In controlling the pressure of a jet stream, response delay, among others, tends to be problematic. Therefore, it is desired to make use of quick and precise measurement of the spinning rate as described above.

There may be further provided display control means for displaying the results of calculation performed by the computing means on display means. According to this configuration, a parameter value providing a basis of control is displayed. This enhances the reliability of the control.

According to the present invention, the difference in time between each gate period and the pulse sequence signal which are not synchronized to each other is found, and the spinning rate per unit time is corrected according to the difference in time. Therefore, spinning measurement error can be eliminated or reduced. This leads to an improvement of the accuracy at which the spinning rate is measured. Consequently, the spinning of the sample tube can be controlled more precisely.

DESCRIPTION OF THE INVENTION

Figure 1:
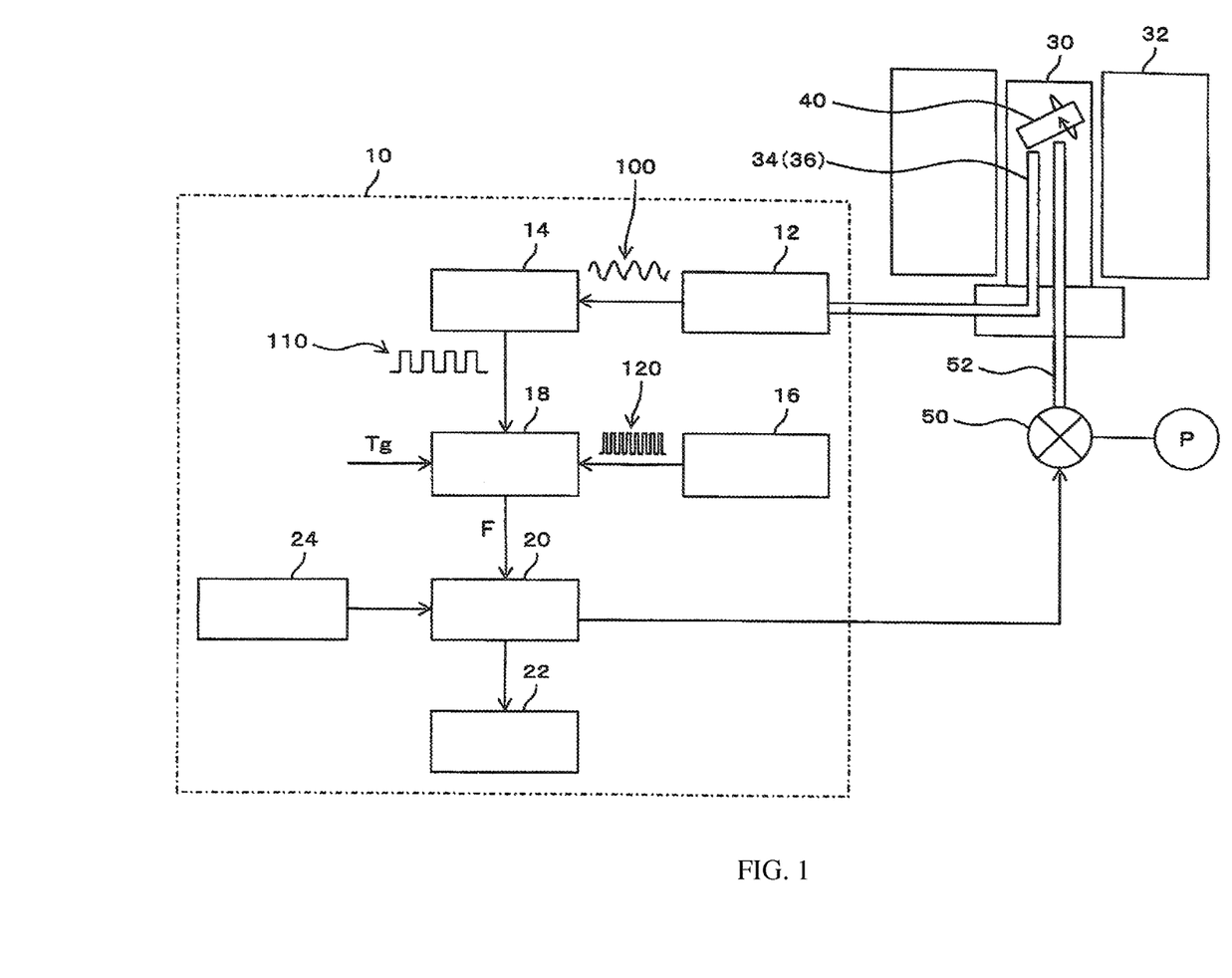
FIG. 1 is a block diagram of a spinning controller associated with one embodiment of the present invention, the controller being used for an NMR sample tube.

Referring to FIG. 1, there is shown an NMR measurement system including a spinning controller associated with one embodiment of the present invention, the controller being used for an NMR sample tube. In the present embodiment, the NMR measurement system performs NMR measurements on solid samples. At this time, the very thin sample tube is spun at ultrahigh speeds. The NMR sample tube, 40, is installed in the head of an NMR probe 30. The sample tube 40 is inserted in a bore 32 formed in a static magnetic field generator together with the NMR probe 30. A sample tube spinner (not shown) for spinning the sample tube 40 is installed in the head of the NMR probe 30. An NMR detection circuit (not shown) is installed in the head of the NMR probe 30 and has a transmit/receive coil for generating an RF magnetic field and detecting an NMR signal emanating from a nuclide to be observed. The NMR measurement system further includes transmit and receive signal processing circuitry and a spectrometer (none of which are shown in FIG. 1).

Figure 2A:
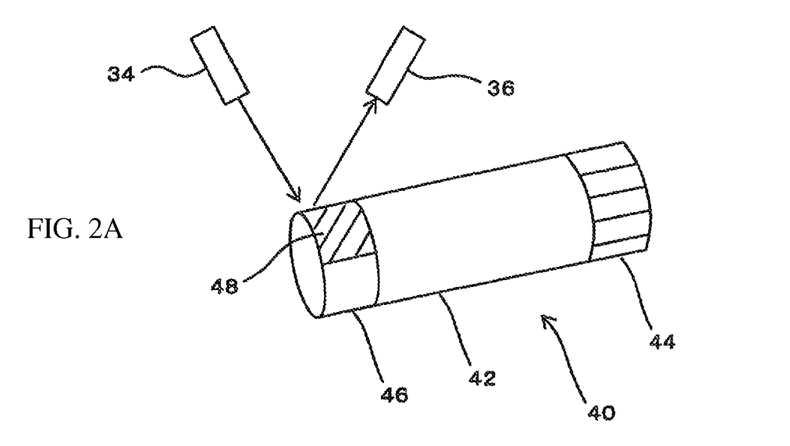
FIG. 2A is a schematic perspective view of one example of the sample tube shown in FIG. 1.

One example of the sample tube 40 is shown in FIG. 2A, which is a schematic perspective of the sample tube 40. As shown, the sample tube 40 includes a sample holding portion 42 having a cylindrical shape and accommodating a sample therein, an impeller 44 mounted at one end of the sample holding portion 42, and a cap 46 mounted at the other end of the sample holding portion 42 and acting as a cover over the sample holding portion 42. The aforementioned transmit/receive coil is disposed to surround the sample holding portion 42. Generally, used sample tubes have outside diameters of several millimeters to tens of millimeters. The diameter of the sample tube 40 according to the present embodiment is 0.75 mm, for example. That is, the sample tube 40 is less than 1 mm in outside diameter and very thin. The quite thin sample tube 40 is spun at quite high speeds. The sample to be investigated is a solid sample. However, a solution sample may also be used.

The sample tube 40 is held in a non-contacting manner in the head of the NMR probe 30 by an air bearing. A jet stream supplied from a pump P via a control valve 50 and a fluid channel 52 shown in FIG. 1 is blown against the blades of the impeller 44 shown in FIG. 2. This creates a propelling force to drive the sample tube 40, thus spinning the sample tube 40. For example, where an NMR measurement on a solid sample is performed, the axis of rotation of the sample tube 40 is tilted at the magic angle to the direction of the static magnetic field. The sample tube 40 is spun at high speed while the magic angle is maintained. During spinning of the sample tube 40, the transmit/receive coil generates an RF magnetic field. During a subsequent reception period, the resulting NMR signal is detected by the transmit/receive coil. An optical spectrum is created by analyzing the NMR signal.

Figure 2B:
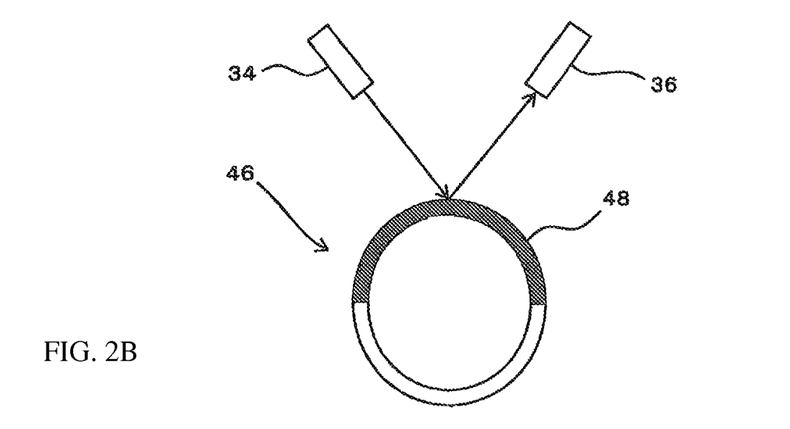
FIG. 2B is a cross sectional view of the sample tube shown in FIG. 2A.

FIG. 2B is a schematic cross section of the sample tube 40 as viewed from a side of the cap 46. As shown in FIGS. 2A and 2B, a member 48 for absorbing or reflecting light is formed on the side surface of the cap 46 of the sample tube 40. For example, this member 48 is a black body or reflector applied to the side surface of the cap 46. As an example, the single member 48 is applied over 180 degrees on the side surface of the cap 46. Alternatively, plural members 48 may be formed on the side surface of the cap 46. Instead of the cap 46, the member 48 may be formed in a front end portion of the impeller 44 or on the side surface of the sample holding portion 42.

Referring back to FIG. 1, a sending optical fiber 34 emitting light and a receiving optical fiber 36 receiving light are laid in the head of the NMR probe 30. Light exiting from the sending optical fiber 34 is directed at the side surface of the cap 46, reflected off the side surface of the cap 46, and enters the receiving optical fiber 36. These components together constitute a spinning detection portion, which may be formed as a part of the NMR sample tube spinning controller described below. Of course, the illustrated configuration is merely exemplary.

The NMR sample tube spinning controller 10 shown in FIG. 1 includes a photoelectric converter 12, a wave shaper 14, a high-speed clock generator 16, an arithmetic unit 18, a control unit 20, a display portion 22, and an input portion 24. The spinning controller 10 refers to the spinning speed of the sample tube 40 and controls the spinning of the sample tube 40 such that the spinning speed agrees with a preset value.

The photoelectric converter 12 is connected with the optical fibers 34 and 36 and has a light source that emits light continuously. The emitted light is supplied to the sending optical fiber 34, is reflected by the side surface of the cap 46, and enters the receiving optical fiber 36. The converter 12 then receives the reflected light, converts it into an electrical signal, and outputs it. Consequently, a spinning signal 100 indicating variations of level of the reflected light is created and output. A laser, an LED, or the like is used as the light source.

The wave shaper 14 wave shapes the spinning signal 100 to create and output the pulse sequence signal 110 consisting of a plurality of pulses representing spinning. Where the spinning signal 100 is a rectangular wave, processing by the wave shaper 14 is dispensed with.

The high-speed clock generator 16 outputs a clock signal, which is sufficiently faster than the spinning rate (rotational speed) of the sample tube 40, to the arithmetic unit 18. In the present embodiment, the high-speed clock signal provides a basis of the operation of the apparatus. The gate periods are generated by frequency-dividing the clock signal.

The arithmetic unit 18 obtains a count value Ns by setting given gate periods Tg for the pulse sequence signal 110 and counting the number of pulses within each gate period Tg. In the present embodiment, the arithmetic unit 18 has a correcting function of finding the differences in time between each gate period Tg and the pulse sequence signal 110 occurring at the beginning and ending of the gate period Tg because the pulse sequence signal 110 is asynchronous with the gate period Tg, by making use of a high-speed clock signal 120, and of correcting the length of the gate period Tg using the differences in time. The arithmetic unit 18 finds the spinning rate (rotational speed) F of the sample tube 40, based on the count value Ns and the corrected gate period Tg'.

The control unit 20 provides feedback control by adjusting the opening of the control valve 50 so as to adjust the pressure of the jet stream to bring the spinning rate F into coincidence with a preset spinning rate. As one example, the feedback control is implemented by PID control. The control unit 20 may display the spinning rate F on the display portion 22. The sample tube 40 may be spun by a motor such as an ultrasonic motor. In this case, the control unit 20 controls the operation of the motor such that the spinning rate F agrees with the preset spinning rate.

One example of the input portion 24 is a user interface via which information about the preset spinning rate of the sample tube 40 and the type of the NMR probe 30 is entered.

Figure 3:
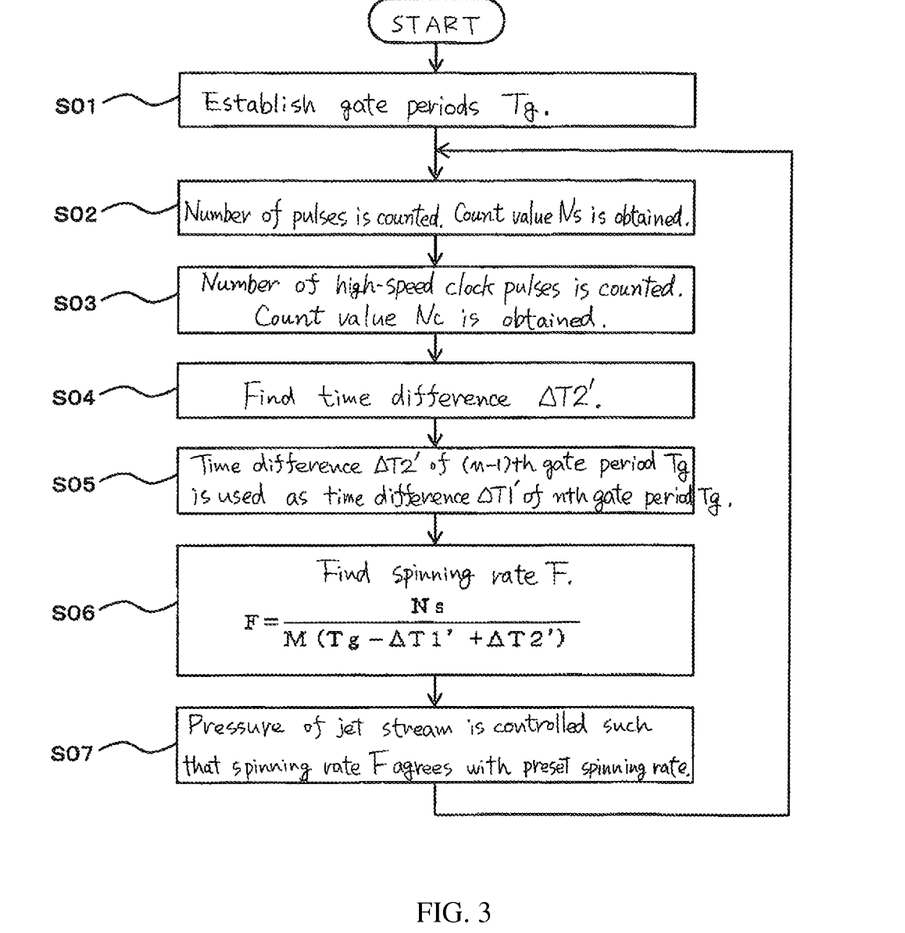
FIG. 3 is a flowchart illustrating one example of subroutine performed by the spinning controller shown in FIG. 1.

A subroutine performed by the arithmetic unit 18 is next described by referring to the flowchart of FIG. 3. First, in response to the pulse sequence signal 110 shown in FIG. 4, the arithmetic unit 18 sets gate periods Tg for the pulse sequence signal 110 representing the spinning (S01). The arithmetic unit obtains a count value Ns by counting the number of pulses in each gate period Tg (S02). In the illustrated example, a plurality of successive gate periods Tg is set for the pulse sequence signal 110. The following description is provided while taking notice of the nth gate period Tg, where n is an integer.

Figure 4:
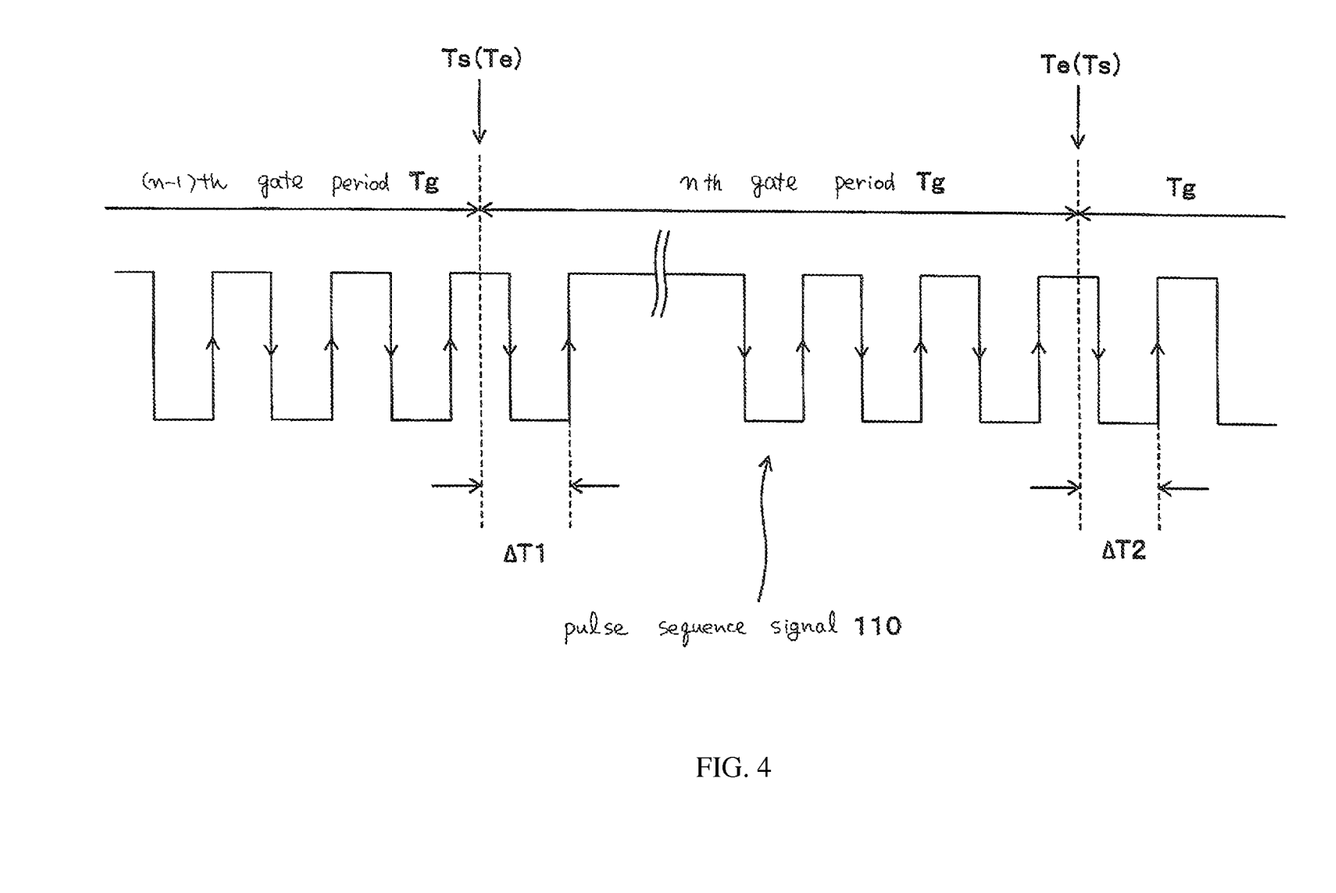
FIG. 4 is a diagram illustrating one example of the relationship between a pulse sequence signal representing spinning and gate periods.

Referring to FIG. 4, the pulse sequence signal 110 representing the spinning rate is asynchronous with the gate period Tg. The starting point Ts and the ending point Te of the gate period Ts do not coincide in timing with rising edges of the pulses. For example, a time difference of ΔT1 occurs from the starting point Ts of the nth gate period Tg to the rising edge of the first pulse. A time difference of ΔT2 occurs from the ending point Te of the nth gate period Tg to the rising edge of the next pulse. That is, the time difference of ΔT1 occurs between the starting point Ts and the rising edge of the first pulse within the nth gate period Tg around the beginning of this gate period Tg. The time difference of ΔT2 occurs between the ending point Te of the nth gate period Tg and the rising edge of the next pulse within this gate period Tg around the ending of this gate period Tg. The arithmetic unit 18 finds the time differences ΔT1 and ΔT2 and corrects the durations of the gate periods Tg by operations described below. In FIG. 4, the rising edges of the pulses are indicated by upwardly directed arrows. The falling edges are indicated by downwardly directed arrows. The same conventions also apply to FIGS. 5 and 6. A pulse is detected by detecting one of its rising and falling edges.

Figure 5:
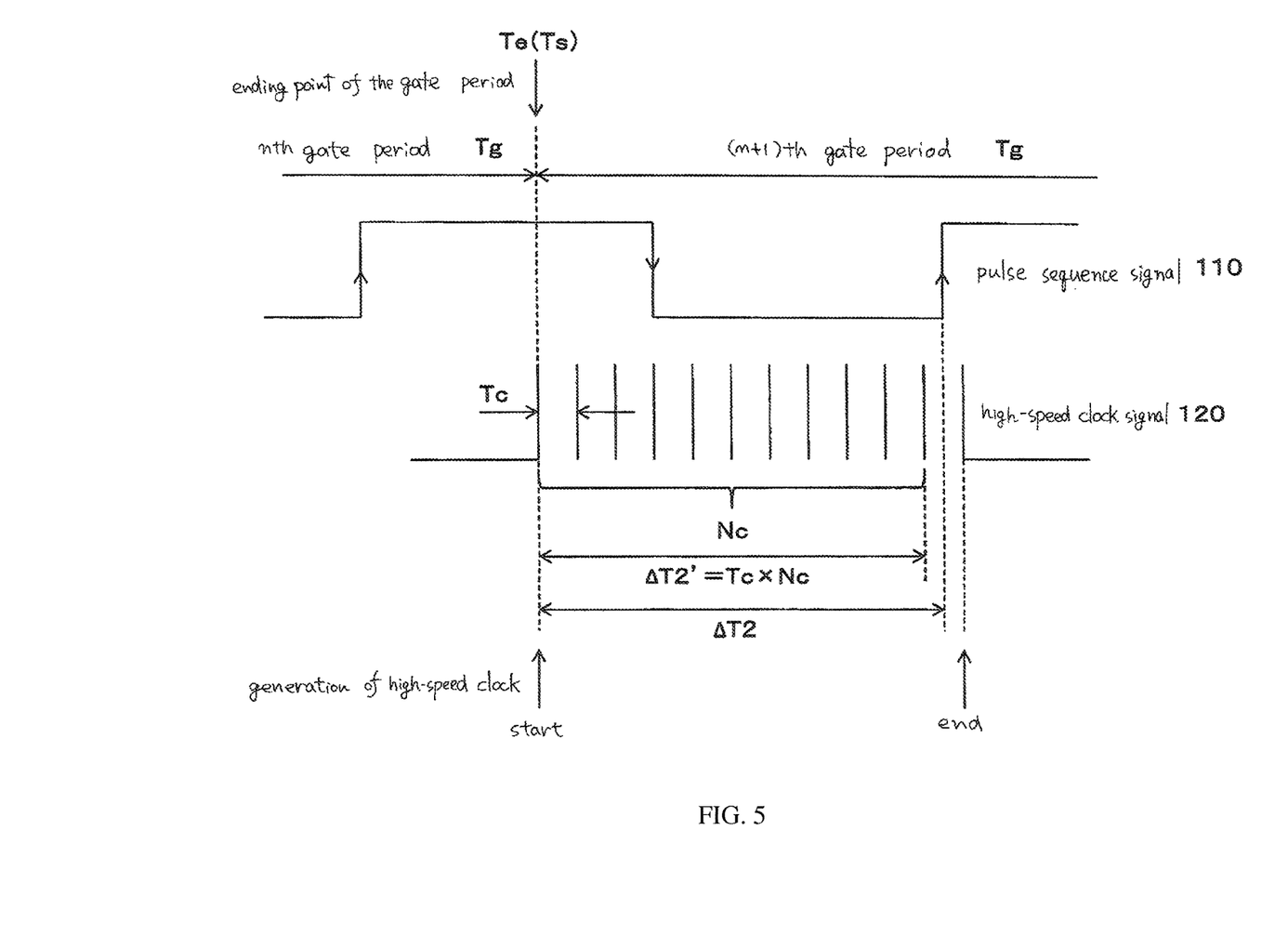
FIG. 5 is a diagram illustrating one example of the relationship between the pulse sequence signal and a high-speed clock signal.

The arithmetic unit 18 shown in FIG. 1 receives the high-speed clock signal 120 from the high-speed clock generator 16, compares the pulse sequence signal 110 and the high-speed clock signal 120 as shown in FIG. 5 and counts the number of high-speed clock pulses contained in the period beginning with the end of the nth gate period Tg and ending with the rising edge of the next pulse, thus obtaining a count value Nc (S03).

Using the period Tc of the high-speed clock signal 120 and the count value Nc, the arithmetic unit 18 finds a time difference ΔT2' in accordance with the following Eq. (4) (S04).

$$\Delta T2' = \text{period } Tc \times \text{count value } Nc \quad (4)$$

Since the high-speed clock signal 120 is generated by the high-speed clock generator 16, the period Tc is a known value.

The true time difference ΔT2 from the ending point Te of the gate period Tg to the rising edge of the next pulse is given by $$\Delta T2' \leq \Delta T2 < \Delta T2' + Tc \quad (5)$$

That is, since time is detected at intervals of the period Tc, an error corresponding to the period Tc occurs at maximum. However, where the period of the high-speed clock signal 120 is sufficiently short, such error can be neglected practically.

Taking note of the (n−1)th gate period Tg set immediately prior to the nth gate period Tg, the time difference ΔT2' around the ending point found regarding the (n−1)th gate period Tg is also the time difference ΔT1' around the beginning of the nth gate period Tg. To permit this relationship to be utilized between adjacent gate periods Tg, the arithmetic unit 18 reuses the time difference ΔT2' around the ending time found regarding the (n−1)th gate period Tg also as the time difference ΔT1' around the beginning of the nth gate period Tg (S05). That is, one time difference is used in two gate periods Tg. With respect to the first gate period Tg of n=1, any gate period set immediately previously does not exist and so the relation ΔT1'=0 is introduced. If the duration of the gate period Tg contains error at the beginning of spinning of the sample tube 40, it presents no problems in practice.

In the same way as the true time difference ΔT2, the true time difference ΔT1 from the starting point Ts of the gate period Tg to the rising edge of the first pulse is given by $$\Delta T1' \leq \Delta T1 < \Delta T1' + Tc \quad (6)$$

The arithmetic unit 18 finds the spinning rate F of the sample tube 40 every gate period Tg in accordance with the following Eq. (7), using the count value Nc, time differences ΔT1', ΔT2', and gate period Tg (S06).

$$F = Ns|M(Tg - \Delta T1' + \Delta T2') \quad (7)$$

That is, the duration of each gate period Tg is corrected using the time differences ΔT1' and ΔT2'. In particular, the starting point of the gate period Tg is shifted backwardly by an amount corresponding to the time difference ΔT1' such that the starting point of the corrected gate period Tg' agrees in timing with the rising edge of the pulse (i.e., the time difference around the beginning point is reduced). The ending point of the gate period Tg is shifted backwardly by an amount corresponding to the time difference ΔT2' such that the ending point of the gate period Tg' agrees in timing with the rising edge of the pulse (i.e., the time difference around the ending point is added).

M included in Eq. (7) is the number of pulses detected during one rotation of the sample tube 40. In the example shown in FIG. 2, one member 48 is formed on the surface of the sample tube 40 and, therefore, one pulse is detected while the sample tube 40 makes one rotation. Therefore, in this case, M=1.

The arithmetic unit 18 finds the spinning rate F every gate period Tg and outputs the spinning rate F for each gate period Tg to the control unit 20. That is, the arithmetic unit 18 finds time differences ΔT1' and ≠T2' in the (n−1)th, nth, (n+1)th, . . . , gate periods Tg, finds the spinning rate F in each gate period Tg, and outputs them to the control unit 20.

The control unit 20 adjusts the opening of the control valve 50 for adjusting the pressure of the jet stream such that the spinning rate F agrees with the preset spinning rate (S07). Subsequently, steps S02 to S07 are repeatedly carried out. Consequently, the spinning rate F in each gate period Tg is detected, and feedback control responsive to the spinning rate F is provided. Whenever the spinning rate F is detected, the control unit 20 may provide feedback control. Alternatively, the controller may provide feedback control, based on the average value of spinning rates F detected in plural gate periods Tg. That is, the control unit may provide feedback control at intervals of one or more gate periods Tg.

The control unit 20 may display the spinning rate F on the display portion 22. In this case, the control unit 20 may display the spinning rate F in each gate period Tg on the display portion 22. Alternatively, the control unit may find the average value of spinning rates F in plural gate periods Tg and display the average value on the display portion 22.

Figure 6:
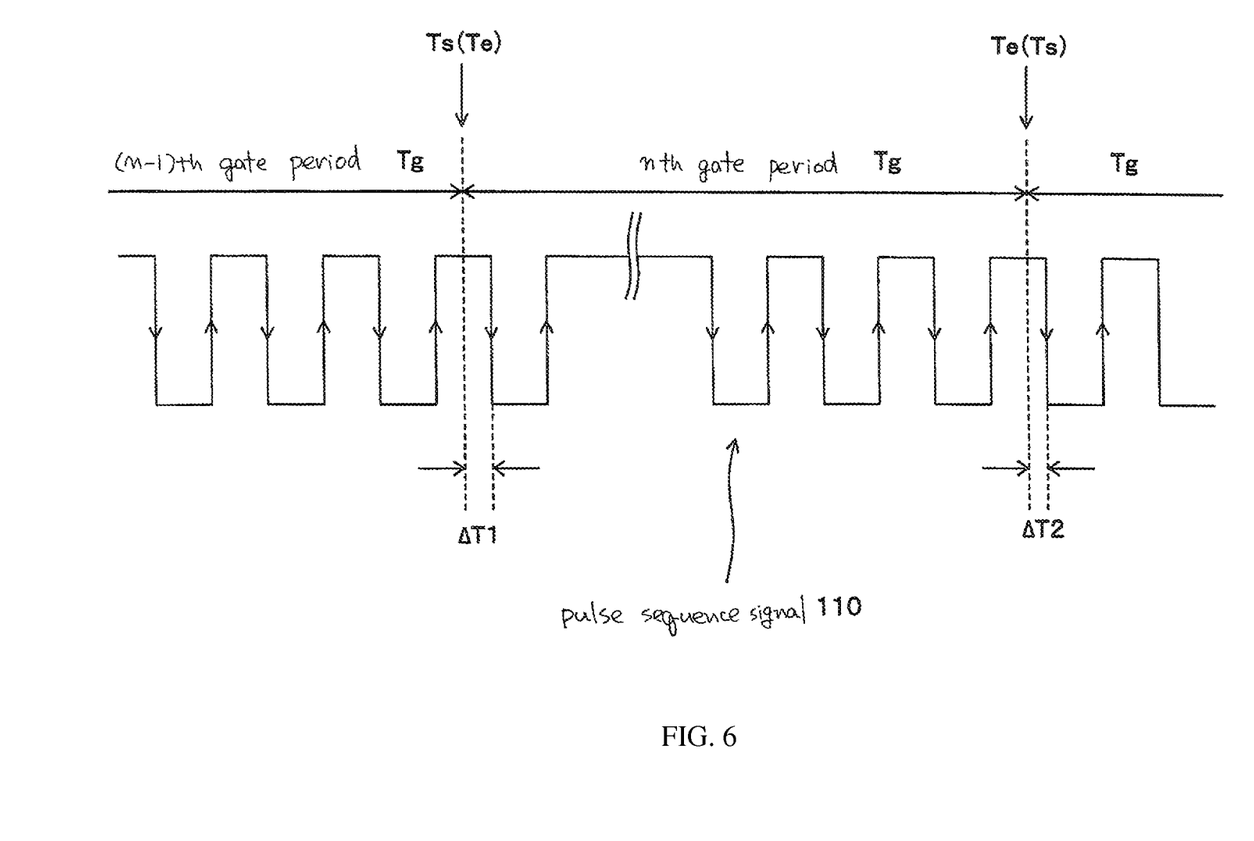
FIG. 6 is a diagram illustrating one example of the relationship between the pulse sequence signal representing spinning and gate periods.

In the example of FIGS. 4 and 5, the time differences ΔT1' and ΔT2' are found based on the rising edge of each pulse that represents spinning. Alternatively, the time differences ΔT1' and ΔT2' may be found based on the falling edge of each pulse. Referring to FIG. 6, the arithmetic unit 18 compares the pulse sequence signal 110 and the high-speed clock signal 120 and counts the number of the high-speed clock pulses contained in the period beginning with ending of the gate period Tg and ending with the falling edge of the next pulse, thus finding the time difference ΔT2' around the ending of the gate period Tg. The arithmetic unit 18 finds the spinning rate F in accordance with Eq. (7) above, using the time difference ΔT2' around the ending of the (n−1)th gate period Tg as the time difference ΔT1' around the beginning of the nth gate period Tg.

For reference, the accuracy at which the spinning rate F found as described above is measured is described. As described previously, the true time difference ΔT2 is given by Eq. (5). The true time difference ΔT1 is given by Eq. (6). Accordingly, the true spinning rate F is given by $$\{Ns|M(Tg + (\Delta T2' + \Delta T' + TC))\} \leq F \text{ and} \quad (8)$$

$$F \leq \{Ns|M(Tg + (\Delta T2' - \Delta T1' - Tc))\}$$

The accuracy at which the spinning rate F is measured is given by $$\text{measuring accuracy} = \pm (Ns \cdot Tc)/(M \cdot Tg^2) \quad (9)$$

As an example, it is assumed that gate period Tg=50 msec, period Tc of the high-speed clock signal 120 is 1 μsec, spinning rate F (spinning speed) of the sample tube 40=50, 000 Hz, and M=1. Substituting Tg=0.05, Tc=10$^{-6}$, M=1, Ns=2500 (=F×Tg=50,000×0.05) into Eq. (8) yields measuring accuracy=1 Hz. In this way, according to the configuration of the present embodiment, the spinning rate F can be measured, for example, at measuring accuracy of 1 Hz.

As described so far, measurement error of the spinning rate caused by the time differences between the gate period Tg and the pulse sequence signal 110 can be reduced by finding the time differences ΔT1' and ΔT2' using the high-speed clock signal 120 and correcting the duration of the gate period Tg. Therefore, the accuracy at which the spinning rate F is measured can be improved. As a result, the spinning of the sample tube 40 can be controlled more precisely.

For example, where the sample tube 40 is spun by the pressure of a jet stream, the spinning may involve fluctuations and the spinning signal 100 may contain fluctuating components. Even in this case, according to the present embodiment, the spinning rate F can be measured accurately by correcting the durations of the gate periods Tg.

Furthermore, in the present embodiment, if the durations of the gate periods Tg are not set to a long time, the spinning rate F can be measured at high accuracy. This makes it unnecessary to set long the intervals at which feedback control is provided. Consequently, the responsiveness of the feedback control is improved. In the above-described example, the spinning rate F can be measured at an accuracy of 1 Hz simply by establishing gate periods Tg having a duration of only 50 msec. Hence, the spinning can be controlled more stably by providing feedback control at intervals of the gate periods Tg.

Incidentally, the spinning rate F of the sample tube 40 can be measured using only the high-speed clock signal 120. If measurements are made using the high-speed clock signal 120 at all times, the amount of data detected is much greater than where the high-speed clock signal 120 is used only when the time differences ΔT1' and ΔT2' are found. In contrast, the amount of handled data can be curtailed by establishing the gate periods Tg, counting the number of pulses representing spinning, and using the high-speed clock signal 120 when the time differences ΔT1' and ΔT2' are used as in the present embodiment. Consequently, any device which would be needed to process a huge amount of data is dispensed with. Increases in the manufacturing cost can be suppressed.

The measuring method associated with the present embodiment and a related art method are next compared. In the related art method, the measuring accuracy is given by 1/(M·Tg) as given by Eq. (4) above. If one attempts to obtain a measuring accuracy of 1 Hz under the condition where M=1, it is necessary that each gate period Tg be 1 second or longer in duration. For example, where a solid sample is measured, it is necessary to spin the sample tube 40 at a spinning rate of 6,000 to 10,000 revolutions per second. Therefore, if gate periods Tg each having a duration of 1 second or longer are established and feedback is provided, then the responsiveness of the feedback control will be impaired. In contrast, in the present embodiment, in order to obtain a measuring accuracy of 1 Hz, it is only required to establish gate periods Tg each having a duration of only 50 msec or so. This prevents delay of the feedback control. The responsiveness of the feedback control can be improved. In particular, in the related art, feedback control is provided at intervals of 1 second or longer in order to obtain a measuring accuracy of 1 Hz. In the present embodiment, even if feedback control is provided at intervals of 50 msec, a measuring accuracy of 1 Hz is obtained. In consequence, the responsiveness of the feedback control is improved over the related art.

A plurality of members 48 may be formed on the surface of the sample tube 40 and the spinning rate F may be found under the condition where M>1. This improves the detection resolution, resulting in still improved measuring accuracy of the spinning rate F. However, it is not easy to regularly form the plural members 48 on the surface of the minute sample tube 40 and to output plural pulses regularly. For this reason, it is not easy to improve the measuring accuracy simply by increasing M. In the present embodiment, the measuring accuracy is improved by correcting the gate periods Tg without forming the plural members 48. In this way, the measuring accuracy can be improved by a simpler method.

Furthermore, the preset spinning rate may be switched according to the type of the NMR probe 30. The control unit 20 obtains probe type information (e.g., a probe ID) indicating the type of the NMR probe 30, for example, from the memory incorporated in the probe 30 and selects a preset spinning rate corresponding to the type indicated by the probe type information from among a plurality of preset spinning rates. Consequently, the sample tube 40 can be spun at a spinning rate corresponding to the type of the NMR probe 30. Alternatively, the user may enter probe type information via the input portion 24. The control unit 20 may select a preset spinning rate according to the probe type information entered via the input portion 24.

The aforementioned spinning controller 10 for an NMR sample tube incorporates a processor (not shown) such as a CPU. The processor realizes the functions of the arithmetic unit 18 and control unit 20 by executing a program stored in the memory (not shown). The program is stored in a storage device such as a hard disc drive (HDD) via a storage medium such as a CD or DVD or via a communication path such as a network. The program may be previously stored in the storage device such as a hard disc drive. The functions of the arithmetic unit 18 and control unit 20 are implemented by reading the program into a memory such as a RAM from the storage device such as a hard disc drive and executing the program by the processor such as a CPU.

Having thus described our invention with the detail and particularity required by the Patent Laws, what is desired protected by Letters Patent is set forth in the following claims.

The invention claimed is:

1. A spinning controller for an NMR sample tube, said spinning controller comprising:
   computing means for establishing gate periods for a pulse sequence signal representing spinning of the sample tube and produced concomitantly with the spinning of the sample tube and for finding a spinning rate per unit time, based on the number of pulses included in the pulse sequence signal and falling within each of the gate periods; and
   control means for controlling spinning of the sample tube, based on the spinning rate per unit time,
   wherein said computing means has correction means for finding differences in time occurring around the beginning and ending of each of the gate periods due to asynchronization between the pulse sequence signal and the gate periods and for correcting the spinning rate per unit time, based on the differences in time.

2. The spinning controller for an NMR sample tube as set forth in claim 1, wherein said correction means finds a difference in ending time from the ending point of each of the gate periods to a timing at which an immediately subsequently occurring pulse is detected, based on a reference clock signal faster than said pulse sequence signal, the reference clock signal being synchronized with the gate periods.

3. The spinning controller for an NMR sample tube as set forth in claim 2, wherein said correction means uses a difference in ending time of the (n−1)th gate period also as a difference in starting time of the nth gate period and corrects the duration of the nth gate period, based on the differences in starting time and ending time found regarding the nth gate period.

4. The spinning controller for an NMR sample tube as set forth in claim 3, wherein said correction means finds a corrected duration of gate period by subtracting said time difference in starting time from the first-mentioned duration of each of said gate periods and adding said time difference in ending time to the first-mentioned duration and calculates the spinning rate per unit time, based on the corrected duration of gate period.

5. The spinning controller for an NMR sample tube as set forth in any one of claims 1 to 4, wherein said control means controls the pressure of a jet stream for spinning said sample tube, based on the spinning rate per unit time found by the computing means.

* * * * *